United States Patent
Arena-Foster

(12) 
(10) Patent No.: US 6,440,494 B1
(45) Date of Patent: Aug. 27, 2002

(54) IN-SITU SOURCE SYNTHESIS FOR METAL CVD

(75) Inventor: Chantal Arena-Foster, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/543,175

(22) Filed: Apr. 5, 2000

(51) Int. Cl.$^7$ ........................... C23C 16/18; C23C 16/08
(52) U.S. Cl. ........................................ 427/250; 427/253
(58) Field of Search ................................. 427/250, 252, 427/253

(56) References Cited

U.S. PATENT DOCUMENTS

| | | | | |
|---|---|---|---|---|
| 5,085,731 A | * | 2/1992 | Norman et al. | 427/250 |
| 5,227,340 A | * | 7/1993 | Pintchovski et al. | 427/69 |
| 5,322,712 A | * | 6/1994 | Norman et al. | 427/250 |
| 5,346,730 A | * | 9/1994 | Kruck et al. | 427/252 |
| 5,376,409 A | * | 12/1994 | Kaloyeros et al. | 427/252 |
| 5,453,494 A | * | 9/1995 | Kirlin et al. | 427/248.1 |
| 5,628,829 A | | 5/1997 | Foster et al. | |
| 6,040,012 A | | 3/2000 | Anderbourh et al. | |
| 6,090,705 A | * | 7/2000 | Arena et al. | 438/677 |
| 6,090,964 A | * | 7/2000 | Rhee et al. | 427/252 |
| 6,121,140 A | * | 9/2000 | Arena et al. | 438/687 |

FOREIGN PATENT DOCUMENTS

| | | |
|---|---|---|
| EP | 0-222-241 | 5/1987 |
| EP | 0-322-466 | 7/1989 |
| EP | 0-573-348 B | 12/1993 |
| EP | 0573348 B | * 12/1993 |
| JP | 1-308804 | 12/1989 |
| WO | WO-99/07924 | 2/1999 |

OTHER PUBLICATIONS

Norman, J. A. T. et al., New OMCVD Precursors for Selective Copper Metallization, J. of Physique IV, Editions de Physique, vol. 1, Sep. 1, 1991, pp. 271–278, XP–002052419, ISSN: 1155–4339.

* cited by examiner

*Primary Examiner*—Bret Chen
(74) *Attorney, Agent, or Firm*—Wood, Herron & Evans, LLP

(57) ABSTRACT

An in-situ method for synthesis of a vapor type of copper or other metal precursor from a solid source of metal in an oxidation state of 1 or greater The solid source is localized above the wafer and its temperature is controlled independently from the wafer temperature. The solid source may be located, for example, in a showerhead. A metal precursor vapor is produced, and this vapor is drawn onto the wafer, allowing deposition to occur on the wafer and a solid thin metal film to form on the wafer. The invention overcomes the problem of low partial pressure of copper precursors in copper CVD.

30 Claims, 2 Drawing Sheets

US 6,440,494 B1

IN-SITU SOURCE SYNTHESIS FOR METAL CVD

FIELD OF THE INVENTION

The invention relates generally to methods for chemical vapor deposition of a metal, particularly copper, onto a substrate.

BACKGROUND

In the formation of integrated circuits (IC), thin films containing metal and metalloid elements are deposited upon the surface of a semiconductor substrate or wafer. The films provide conductive and ohmic contacts in the circuits and between the various devices of an IC. For example, a thin film of a desired metal might be applied to the exposed surface of a contact or via in a semiconductor substrate. The film, passing through the insulative layers of the substrate, provides plugs of conductive material for the purpose of making interconnections across the insulating layers.

One well known process for depositing a thin metal film is by chemical vapor deposition (CVD). In CVD, reactant or deposition gas precursors are pumped into proximity to a substrate inside a reaction chamber. The precursors are activated using either thermal energy or electrical energy, and subsequently undergo chemical reactions at the surface of the substrate. This results in one or more reaction by-products, which are deposited on the exposed substrate or wafer surface to form a film.

Copper CVD reactions are limited mainly by the low partial pressure of potential copper precursors. In fact, most of the potential precursors have such a low partial pressure that use of a gas mass flow controller (MFC) and vapor draw from a liquid precursor in a vessel is difficult. Instead, direct liquid injection (DLI) of the liquid copper precursor must be used.

DLI of a copper precursor, however, is undesirable for several reasons. One reason is that it requires use of two devices: a first device to form a mist or aerosol of the precursor liquid, and a second device to transform the mist into a precursor vapor. Additionally, during this process the stability of the precursor source is generally a problem; the precursor tends to decompose or change composition along the path of its liquid injection and vaporization. Another reason is that control of the deposition rate is difficult in DLI of the precursor liquid. Also, the DLI device may clog if precursor deposition occurs in the device itself. Moreover, a device such as a showerhead, which is supposed to aid in uniform distribution of precursor at the surface of the wafer or substrate, might become hot enough to participate in decomposition of the copper precursor, and the precursor may deposit on the showerhead. Such an occurrence would make control of precursor delivery to the wafer even more difficult.

What is needed is a way to generate a copper or other metal precursor vapor to avoid problems that arise with injecting a precursor in a liquid state.

SUMMARY OF THE INVENTION

The present invention is directed to a method of generating a metal precursor, such as copper precursor, used for CVD within the deposition reactor. This method generates the vapor precursor from simple elements in-situ, and thus reduces or eliminates the need to obtain a sufficient partial pressure to deliver the copper or other metal precursor. The present invention is also directed to a method of delivering the vapor precursor to the wafer to deposit a thin film. To this end, and in accordance with the principles of the present invention, a solid source of a metal in an oxidation state of 1 or greater is heated in the chamber above the substrate to a temperature at which the source will react with a gas injected into the chamber to form a vapor metal precursor. This precursor is directed toward the substrate, which is heated so as to decompose the precursor onto the substrate surface.

DETAILED DESCRIPTION

A copper or other metal vapor precursor is generated in-situ in a CVD chamber without the aforementioned problem of low partial pressure of the precursor. The present invention forms and uses the vapor precursor directly above the substrate surface thereby minimizing travel of the vapor and the resulting pressure drop. With flow control, the vapor need not travel through the chamber, so vapor conductive loss is less. By the method of the present invention, the partial pressure of the formed vapor becomes less of a limiting factor in the CVD process. The principles of the present invention may be best understood with reference to the drawings and illustrative examples.

Figure 1:
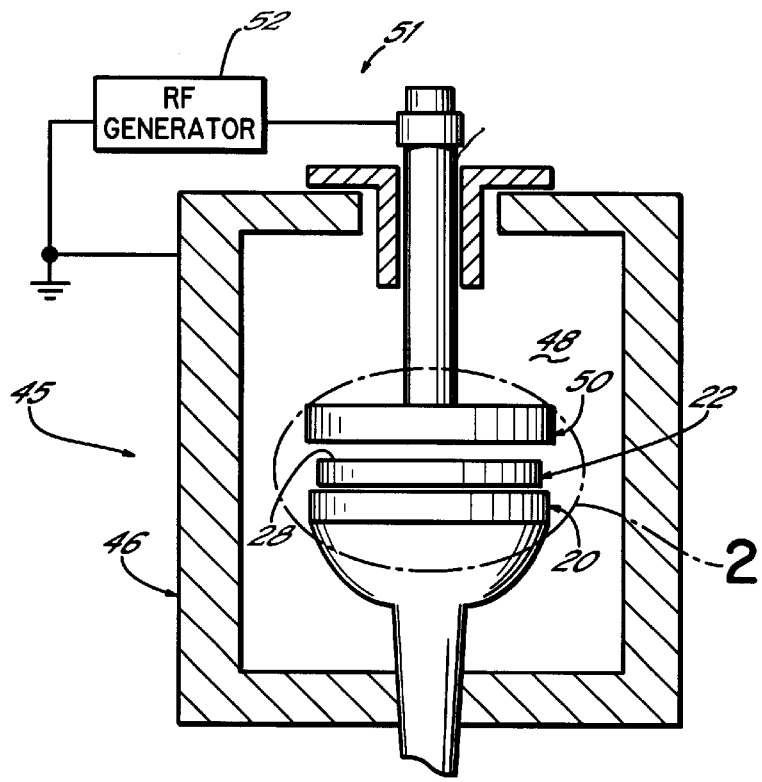
FIG. 1 is a schematic cross-sectional view of a reaction chamber in the practice of the invention.

With reference to FIG. 1, a reactor 45 used for copper deposition on the surface 28 of a semiconductor substrate 22 by CVD is illustrated. The reactor 45 includes a reaction chamber 46 which encloses a processing space 48. In the reaction chamber 46, which is shown as containing a substrate 22 on a susceptor 20, reactant gases for CVD are delivered to a processing space 48. A gas delivery system, such as the system described in U.S. Pat. No. 5,628,829 METHOD AND APPARATUS FOR LOW TEMPERATURE DEPOSITION OF CVD AND PECVD REACTIONS, which is assigned to the Assignee of the present invention and is hereby specifically incorporated in its entirety by reference, provides the proper flow and distribution of the gases for the CVD process. Generally, gas delivery systems contain gas-dispersing elements, such as a flat showerhead 50, in the reaction chamber 46. The showerhead 50 spreads the entering reactant gases around the processing space 48 of the reaction chamber 46 to ensure a uniform distribution and flow of the gases proximate the susceptor 20 and substrate 22. Uniform gas distribution and flow is desirable for a uniform and efficient deposition process, a dense plasma, and a uniformly deposited film.

According to one embodiment of the present invention, the reactor 45 is equipped with a plasma producing apparatus 51 for exposing the susceptor 20 to a hydrogen/argon plasma either prior or subsequent to placing of the substrate 22 thereon for processing. The apparatus 51 to expose the susceptor 20 to the hydrogen/argon plasma may be the type described in U.S. Pat. No. 5,906,866 entitled PROCESS FOR CHEMICAL VAPOR DEPOSITION FOR TUNG- STEN ONTO A TITANIUM NITRIDE SUBSTRATE SURFACE, which is assigned to the Assignee of the present invention and is expressly incorporated herein in its entirety by reference. The apparatus 51 preferably includes a radiofrequency (RF) generator 52, capable of generating 450 KHz, which is attached to the showerhead 50.

Figure 2:
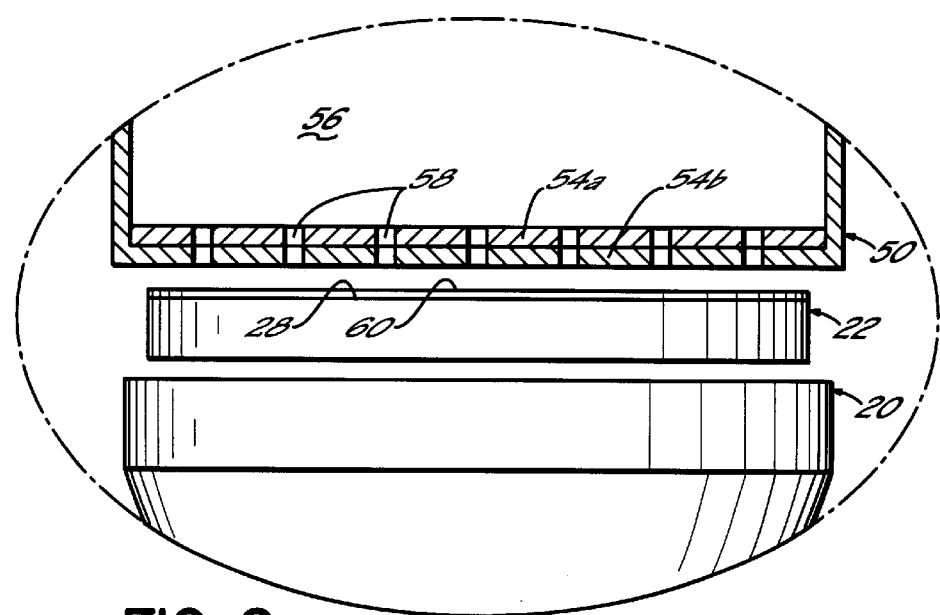
FIG. 2 is an enlarged view of the encircled area 2 of FIG. 1.

In the present invention and with reference to FIG. 2, a showerhead 50 apparatus, as is known to one skilled in the art and as previously described, may be used. The showerhead 50, located above the wafer 22, has two plates. A top plate 54a is made of copper and a bottom plate 54b is made of an inert material with respect to the chemical introduced into the showerhead. For example, 54b may be made of stainless steel or aluminum. The copper of the top plate 54a of the showerhead 50 serves as the main source for the copper that is deposited on the surface 28 of the wafer 22. If a metal other than copper is to be deposited, such as palladium, chromium, nickel or iron, then top plate 54a is made of that metal to provide the source metal for deposition. The showerhead 50 is maintained at a temperature $T_{SH}$ of about 50° C. to about 500° C., and preferably at about 200° C. to 300° C.

A gas mixture that has the property of reacting with copper and forming a volatile copper compound at $T_{SH}$ is injected at a site 56, which is the plenum of showerhead 50.

A gas mixture that has the property of reacting with copper and forming a volatile copper compound at $T_{SH}$ is injected at a site 56, which is a site 56, which is a plenum of showerhead 50. A mixture of an oxidizer gas, a bidendate ligand and a Lewis-based ligand is the gas injected in the plenum of showerhead 50. The oxidizer gas may be any of $Cl_2$, $O_2$, HCl, $SiCl_4$ or $H_2O_2$, and is preferably $Cl_2$. The bidendate ligand may be a diketonate gas (i.e., hexafluoroacetylacetone) or acetylacetone (acac), and is preferably Hhfac. The Lewis-based ligand may be any of trimethylvinylsilane (tmvs), cyclooctadiene (cod) or triethyl phosphine ($TEP_3$), and is preferably tmvs. This mixture of gases react with the copper of the top plate 54a of the showerhead 50 and forms a volatile copper compound, for example, $Cu(hfac)_2$ or hfac—Cu—tmvs. The volatile compound passes through the holes 58 of the showerhead 50 and is directed above the surface 28 of the wafer 22.

The wafer 22 is positioned on the heated susceptor 20, also referred to as a hot plate, which is positioned under the bottom plate 54b of the showerhead 50. The temperature of the wafer 22 is maintained at $T_W$, which is in the range of about 100°–400° C., and preferably about 200° C. $T_W$ is selected to allow the copper precursor to decompose on the wafer surface 28 and form a solid copper film 60. In this process, the copper on the top plate 54a of the showerhead 50 is consumed. Because the method involves metal purification principles, it should be possible to have a very pure vapor of the copper precursor with a minimum of the impurities that could be contained in the solid copper of the top plate 54a of the showerhead 50.

As an example of one chemical path that may be used in the present invention to form the vapor copper precursor, solid copper of the top plate 54a is brought from a zero oxidation state ($Cu^0_{solid}$) to a higher oxidation state ($Cu^{1+}$ or $Cu^{2+}$) by an oxidation reaction with a gaseous compound ("A"). "A" is the same as the oxidizer gas described above, namely $Cl_2$, $O_2$, HCl, $SiCl_4$ or $H_2O_2$, and preferably $Cl_2$. If "A" is a chloride molecule, copper chloride in a solid form $CuCl_{(solid)}$ is formed at $T_{SH}$ at the surface of the top copper plate 54a of the showerhead 50. The oxidation reaction is as follows:

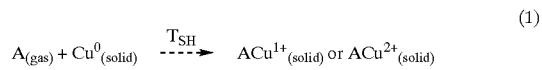

(1)

At the same time or thereafter, a second compound ("B") that can react with the oxidized copper is introduced in the showerhead plenum 56. "B" can bind to the oxidized copper and form a volatile compound ("C"). Compound "B" may be any bidendate ligand, such as Hhfac. Compound "B" may also be a mixture of Hhfac or other bidendate ligand and another Lewis-based ligand ("L") such as tmvs, cod, or $TEP_3$. Where "B" includes Hhfac, compound "C" may be volatile $Cu^{1+}$(hfac) or a $Cu^{2+}$(hfac)-based molecule. The reaction is as follows:

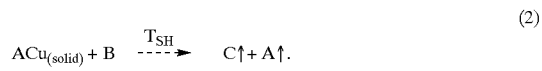

(2)

The newly generated volatile compound "C" is then drawn through the holes 58 of the showerhead 50 above the wafer 22. At $T_W$, two molecules of $Cu^{1+}$(hfac) (tmvs) react together to generate copper metal ($Cu^0$) and by-products according to the following disproportionation reaction:

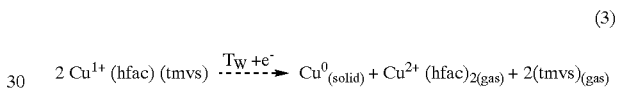

(3)

For $Cu^{2+}$, that is, when copper is oxidized to a higher oxidation state, a reduction reaction, for instance with hydrogen, is necessary to generate copper metal ($Cu^0$). The reduction reaction is as follows:

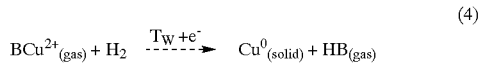

(4)

Volatile compound "B" may be either drawn away, such as by pumping, or recycled in the showerhead 50 together with compound "A".

EXAMPLE 1

Figure 3:
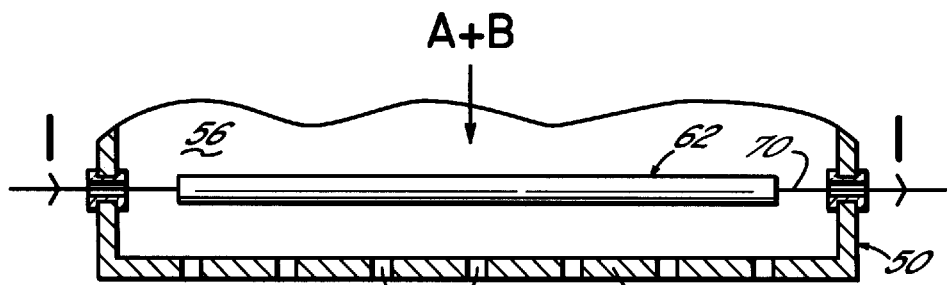
FIG. 3 is an alternative embodiment of the showerhead of FIG. 2.
Figure 4:
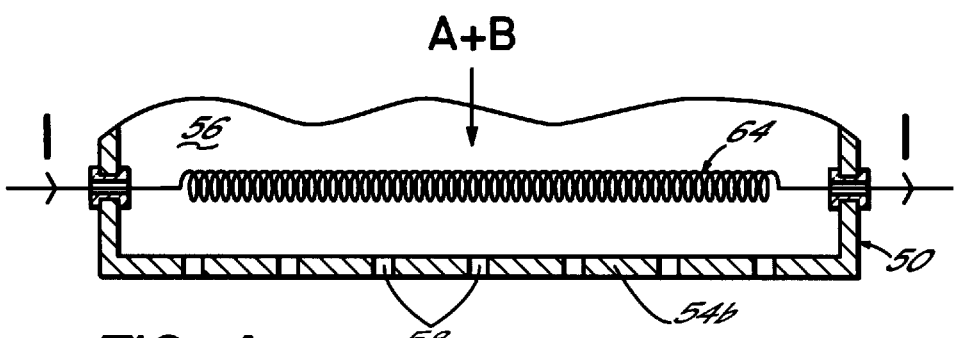
FIG. 4 is another alternative embodiment of the showerhead of FIG. 2.
Figure 5:
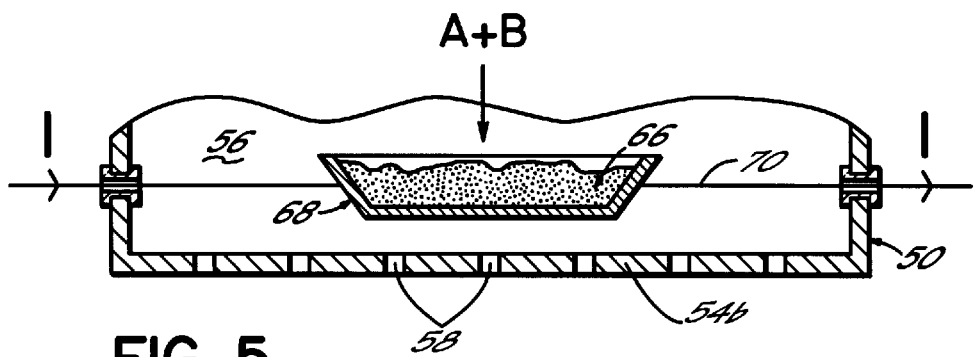
FIG. 5 is yet another alternative embodiment of the showerhead of FIG. 2.

The solid source for copper can be either pure copper ($Cu^0$) or copper in a higher oxidation state, either $Cu^{1+}$ or $Cu^{2+}$, such as CuO or $Cu_2O$. The shape and state of the solid copper source in showerhead 50 may be a top plate 54, as shown in FIG. 2; a cylinder 62, as shown in FIG. 3; a wire 64, as shown in FIG. 4, or a compressed powder of any shape or a powder 66 in a receptacle 68, as shown in FIG. 5. The cylinder 62 and receptacle 68 may be secured within the showerhead 50 by an electrically conductive wire or rod 70.

Heating of the copper source could be thermally assisted, for example, by thermal convection, or radiation from a heating or radiative source. Heating of the copper source may also be electrically assisted. Since copper is a good electrical conductor, the copper source may be connected to an electrical power generator and heated by the Joule effect. The temperature could be controlled through a current flowing in the copper source, as shown in FIGS. 3–5, by connecting wire 64 or wire or rod 70 to the electrical power generator.

Copper in a solid form in a zero oxidation state ($Cu^0$) may react with $Cl_2$. Copper is thereby oxidized to, for example, a $Cu^{1+}Cl$ compound, which is a solid. The reaction is as follows:

$$Cu^0_{(solid)} + Cl_2 \rightarrow Cu^{1+}Cl_{(solid)} \qquad (1)$$

The resulting $Cu^{1+}Cl_{(solid)}$ then reacts with Hhfac and a Lewis-based ligand, tmvs. The products are a hfac-$Cu^{1+}$-tmvs gas and an acid HCl. The reaction is as follows:

$$Cu^{1+}\text{-}Cl_{(solid)} + Hhfac + tmvs_{(gas)} \rightarrow hfac\text{—}Cu^{1+}\text{—}tmvs_{(gas)} + HCl \qquad (2)$$

The resulting copper-ligand compound decomposes to form solid copper in a zero oxidation state ($Cu^0$) and a copper compound with two hfac and two molecules of tmvs. This disproportionation reaction is as follows:

$$2hfac\text{-}Cu^{1+}\text{—}tmvs_{(gas)} \rightarrow Cu^0_{(solid)} + hfac\text{—}Cu\text{—}hfac + 2tmvs \qquad (3)$$

EXAMPLE 2

Copper may be in a higher oxidation state than in Example 1, that is, $Cu^{2-}$. Then, two Hhfac molecules react with $Cu^{2+}Cl_2$ to form hfac—$Cu^{2+}$—hfac+HCl. A protic solvent is then necessary to reduce hfac—$Cu^{2+}$+hfac. Two molecules of the acid Hhfac will be formed as follows:

$$hfac\text{—}Cu^{2+}\text{—}hfac + H_2 \rightarrow Cu^0_{(solid)} + 2Hhfac$$

It should be understood that the embodiments of the present invention shown and described in the specification are only preferred embodiments of the inventors who are skilled in the art and are not limiting in any way. Therefore, various changes, modifications or alterations to these embodiments may be made or resorted to without departing from the spirit of the invention and the scope of the following claims.

What is claimed is:

1. A method for depositing a metal film on a substrate, comprising the steps of:
   providing a solid source of a metal in an oxidation state of 1 or greater in a CVD chamber, the source being positioned above the substrate;
   injecting an organic gas into the chamber and heating the source to a temperature sufficient to react the gas with the solid metal source to form a vapor organometallic precursor;
   directing the vapor organometallic precursor toward the substrate; and
   heating the substrate to a temperature sufficient to decompose the precursor on a surface of the substrate to form a metal film.

2. The method of claim 1, wherein the source is a copper halide.

3. The method of claim 1, wherein the source is selected from the group consisting of copper oxide, copper chloride and combinations thereof.

4. The method of claim 3, wherein said copper is selected from the group consisting of copper having a 1+ oxidation state ($Cu^{1+}$), and copper having a 2+ oxidation state ($Cu^{2+}$).

5. The method of claim 1, wherein the source is a halide or oxide of a metal selected from the group consisting of: copper, palladium, nickel, iron, or chromium.

6. The method of claim 1, wherein the chamber includes a showerhead positioned above the substrate and the source is a plate within the showerhead.

7. The method of claim 1, wherein the chamber includes a showerhead positioned above the substrate and the source is a cylinder in the showerhead.

8. The method of claim 1, wherein the chamber includes a showerhead positioned above the substrate and the source is a wire in the showerhead.

9. The method of claim 1, wherein the chamber includes a showerhead positioned above the substrate and the source is a compressed powder in the showerhead.

10. The method of claim 1, wherein the chamber includes a showerhead positioned above the substrate and the source is a powder in a receptacle in the showerhead.

11. The method of claim 1, wherein the temperature of the source is controlled by electrical current flowing in the source.

12. The method of claim 1, wherein the source is heated with thermal assistance.

13. The method of claim 1 wherein the source is heated with electrical assistance.

14. The method of claim 1, wherein the organic gas comprises a first compound capable of generating a bidendate ligand.

15. The method of claim 14, wherein the first compound is acetylacetonate or hexafluoroacetylacetone.

16. The method of claim 1, wherein the organic gas comprises a second compound capable of generating a Lewis-based ligand.

17. The method of claim 16, wherein the second compound is trimethylvinylsilane, cyclooctadiene or triethyl phosphine.

18. The method of claim 1, wherein the gas comprises a mixture of a first compound capable of generating a bidendate ligand and a second compound capable of generating a Lewis-based ligand.

19. The method of claim 1, wherein the gas comprises a mixture of hexafluoroacetylacetone and trimethylvinylsilane.

20. The method of claim 1, wherein the source is heated to a temperature in the range of about 50° C. to about 500° C.

21. The method of claim 1, wherein the source is heated to a temperature in the range of about 200° C. to about 300° C.

22. The method of claim 1, wherein the substrate is heated to a temperature in the range of about 100° C. to about 400° C.

23. The method of claim 1, wherein the substrate is heated to a temperature of about 200° C.

24. A method for depositing a copper film on a substrate, comprising the steps of:
   providing a solid source of copper in an oxidation state of 1 or greater in a CVD chamber, the source being positioned above the substrate;
   injecting an organic gas into the chamber and heating the source to a temperature sufficient to react the organic gas with the copper to form a copper organovapor precursor, wherein the gas comprises a mixture of a first compound capable of generating a bidendate ligand and a second compound capable of generating a Lewis-based ligand;
   directing the copper organovapor precursor toward the substrate; and
   heating the substrate to a temperature sufficient to decompose the precursor on a surface of the substrate to form a copper film.

25. The method of claim 24, wherein the chamber includes a showerhead positioned above the substrate and the source is a plate within the showerhead.

26. The method of claim 24, wherein the first compound is acetylacetone or hexafluoroacetylacetone.

27. The method of claim 24, where in the second compound is trimethylvinylsilane, cyclooctadiene or triethyl phosphine.

28. The method of claim 24, wherein the gas comprises a mixture of hexafluoroacetylacetone and trimethylvinylsilane.

29. The method of claim 24, wherein the source is heated to a temperature in the range of about 50° C. to about 500° C.

30. The method of claim 24, wherein the substrate is heated to a temperature in the range of about 100° C. to about 400° C.

* * * * *

UNITED STATES PATENT AND TRADEMARK OFFICE
CERTIFICATE OF CORRECTION

PATENT NO. : 6,440,494 B1
DATED : August 27, 2002
INVENTOR(S) : Arena-Foster

It is certified that error appears in the above-identified patent and that said Letters Patent is hereby corrected as shown below:

Column 3,
Lines 26-29, please delete "A gas mixture that has the property of reacting with copper and forming a volatile copper compound at $T_{SH}$ is injected at a site 56, which is a site 56, which is a plenum of showerhead 50."
Line 35, reads "hexafluoroacetylacetone) or" should read
-- hexafluoroacetylacetone [Hhfac]) or --.

Column 5,
Line 21, reads "$Cu^{2-}$" and should read -- $Cu^{2+}$ --.
Line 23, reads "hfac–$Cu^{2+}$ + hfac." and should read -- hfac–$Cu^{2+}$–hfac. --

Column 7,
Line 3, reads ""where in the" and should read -- wherein the --.

Signed and Sealed this

Thirteenth Day of April, 2004

JON W. DUDAS
*Acting Director of the United States Patent and Trademark Office*